United States Patent
Yamamoto

(10) Patent No.: US 10,192,014 B2
(45) Date of Patent: Jan. 29, 2019

(54) CIRCUIT DESIGN SUPPORT APPARATUS AND COMPUTER READABLE MEDIUM

(71) Applicant: MITSUBISHI ELECTRIC CORPORATION, Tokyo (JP)

(72) Inventor: Ryo Yamamoto, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/568,360

(22) PCT Filed: Aug. 27, 2015

(86) PCT No.: PCT/JP2015/074262
§ 371 (c)(1),
(2) Date: Oct. 20, 2017

(87) PCT Pub. No.: WO2017/033336
PCT Pub. Date: Mar. 2, 2017

(65) Prior Publication Data
US 2018/0082006 A1    Mar. 22, 2018

(51) Int. Cl.
*G06F 17/50*    (2006.01)

(52) U.S. Cl.
CPC ........ *G06F 17/5045* (2013.01); *G06F 17/505* (2013.01)

(58) Field of Classification Search
CPC ............... G06F 17/5045; G06F 17/505; G06F 15/7867; G06F 17/5022; G06F 17/5054;
(Continued)

(56) References Cited

U.S. PATENT DOCUMENTS 5,550,749 A * 8/1996 Dey ............... G01R 31/318591
716/104
6,421,809 B1 * 7/2002 Wuytack ................. G06F 8/433
716/132
(Continued)

FOREIGN PATENT DOCUMENTS

JP    4-117570 A    4/1992
JP    10-256383 A    9/1998
(Continued)

*Primary Examiner* — Nha T Nguyen
(74) *Attorney, Agent, or Firm* — Birch, Stewart, Kolasch & Birch, LLP

(57) ABSTRACT

A scheduling result file (103) indicates that one or more processes are assigned to each of a plurality of process steps to be executed sequentially. A target specification section (120) specifies a target process that is a process performing computation and an identical-type process that is a process assigned to a process step executed after a process step to which the target process has been assigned and performing computation which is identical in type to the target process among processes in the scheduling result file. A destination specification section (130) specifies, as a destination step, a process step that enables a computing unit to be shared between the target process and the identical-type process when the target process is assigned. A scheduling change section (150) changes description of the scheduling result file to description in a state in which the target process has been assigned to the destination step.

7 Claims, 19 Drawing Sheets

(58) Field of Classification Search
CPC .... G06F 2217/08; G06F 8/433; G06F 8/4442; G06F 9/3001; G06F 9/3887
See application file for complete search history.

(56) References Cited

U.S. PATENT DOCUMENTS

| | | | |
|---|---|---|---|
| 8,127,259 B2* | 2/2012 | Aoyama | G06F 17/505 703/13 |
| 9,858,373 B2* | 1/2018 | Cho | G06F 17/5045 |
| 2001/0016936 A1 | 8/2001 | Okada et al. | |
| 2005/0010387 A1* | 1/2005 | Morishita | G06F 17/5045 703/14 |
| 2005/0289499 A1* | 12/2005 | Ogawa | G06F 17/5045 716/104 |
| 2006/0225022 A1* | 10/2006 | Ezaki | G06F 17/5045 716/103 |
| 2007/0214447 A1 | 9/2007 | Okada | |
| 2008/0040699 A1 | 2/2008 | Okada | |
| 2009/0326901 A1* | 12/2009 | Kojima | G06F 17/5045 703/14 |
| 2011/0276929 A1* | 11/2011 | Imai | G06F 17/5022 716/102 |
| 2013/0091482 A1* | 4/2013 | Carrion | G06F 17/505 716/132 |
| 2013/0132916 A1* | 5/2013 | Ootsubo | G06F 17/5045 716/104 |
| 2013/0346929 A1* | 12/2013 | Toi | G06F 17/505 716/104 |
| 2014/0019726 A1* | 1/2014 | Toi | G06F 9/3001 712/221 |
| 2014/0053119 A1* | 2/2014 | Meredith | G06F 17/5045 716/102 |
| 2014/0258948 A1* | 9/2014 | Jensen | G06F 17/505 716/104 |
| 2015/0106774 A1* | 4/2015 | Yasunaka | G06F 17/505 716/102 |
| 2016/0299998 A1* | 10/2016 | Isshiki | G06F 17/505 |
| 2017/0017747 A1* | 1/2017 | Cho | G06F 17/5045 |
| 2018/0039722 A1* | 2/2018 | Okada | G06F 17/5045 |

FOREIGN PATENT DOCUMENTS

| | | |
|---|---|---|
| JP | 11-120210 A | 4/1999 |
| JP | 2000-187681 A | 7/2000 |
| JP | 2001-229217 A | 8/2001 |
| JP | 2006-139427 A | 6/2006 |
| JP | 2006-285865 A | 10/2006 |
| JP | 2007-213265 A | 8/2007 |
| JP | 2009-25973 A | 2/2009 |

* cited by examiner

Fig. 4

101: SOURCE CODE

```
LOOP_1:
for(int i = 0; i < 1024; i++) {
 c[i] = a[i] * b[i];
   ...
 s = func0(a[i], b[i]);
} p = func1(s, t);

LOOP_2:
for(int i = 0; i < 1024; i++) {
 d[i] = c[i] * p;
}
```

Fig. 7

104: STEP RESULT FILE

| COMPUTING UNIT/ MEMORY | LOOP1 (1024 LOOPS) | | NonLOOP | LOOP2 (1024 LOOPS) | |
|---|---|---|---|---|---|
| | ST1 | ST2 | ST1 | ST1 | ST2 |
| mul | USE | – | – | – | – |
| func0 | USE | – | – | – | – |
| MEM_0 | – | W | – | R | – |
| mul | – | – | – | – | USE |
| func1 | – | – | USE | – | – |

Fig. 9

191: IDENTICAL-TYPE COMPUTING UNIT LIST

| IDENTICAL-TYPE COMPUTING UNIT NAME | IDENTICAL-TYPE STEP NAME |
|---|---|
| mul | LOOP1_ST1 |
| | LOOP2_ST2 |

Fig.10

192:TARGET PROCESS LIST

| PROCESS NAME | PROCESS STEP NAME |
|---|---|
| mul | LOOP1_ST1 |
| | LOOP2_ST2 |

Fig.12

192:TARGET PROCESS LIST

| PROCESS NAME | PROCESS STEP NAME | DESTINATION STEP NAME |
|---|---|---|
| mul | LOOP1_ST1 | LOOP2_ST1 |
| | LOOP2_ST2 | |

Fig.14

192:TARGET PROCESS LIST

| PROCESS NAME | PROCESS STEP NAME | DESTINATION STEP NAME | LIFE CYCLE |
|---|---|---|---|
| mul | LOOP1_ST1 | LOOP2_ST1 | 1 |
| | LOOP2_ST2 | | 1024 |

Fig.17

194:STEP CHANGE FILE

| COMPUTING UNIT/ MEMORY | LOOP1 (1024 LOOPS) | | NonLOOP | LOOP2 (1024 LOOPS) | |
|---|---|---|---|---|---|
| | ST1 | ST2 | ST1 | ST1 | ST2 |
| func0 | USE | – | – | – | – |
| MEM_1 | – | W | – | R | – |
| MEM_2 | – | W | – | R | – |
| mul | – | – | – | USE | USE |
| func1 | – | – | USE | – | – |

CIRCUIT DESIGN SUPPORT APPARATUS AND COMPUTER READABLE MEDIUM

TECHNICAL FIELD

The present invention relates to a technique for supporting circuit design.

BACKGROUND ART

A semiconductor integrated circuit is designed at RTL (Register Transfer Level).

In circuit design at RTL, the operation of a combined circuit is described. A combined circuit receives, as an input, an output of a flip flop functioning as a register and performs an output according to the state of the input.

In recent years, the circuit scale of an integrated circuit is increased and circuit design using RTL takes much time.

Accordingly, a technique called high level synthesis for automatically generating RTL using a high level language, which is more abstract than RTL, has been proposed and high level synthesis tools for achieving high level synthesis are now on the market. Examples of the high level language are the C language, the C++ language, and the SystemC.

In addition, when RTL is generated by the high level synthesis, the circuit scale of a semiconductor integrated circuit may be reduced as compared with the case in which RTL is generated manually. This is because circuit sharing can be performed automatically in high level synthesis.

The high level synthesis has been used to design an ASIC (Application Specific Integrated Circuit), and has been also often applied to an FPGA (Field Programmable Gate Array).

In the case of the ASIC, as the number of memories to be used and the number of multipliers to be used are increased, the circuit scale is enlarged.

In contrast, since memories and multipliers are provided in the FPGA in advance, the circuit scale of the FPGA is not enlarged as long as the number of memories to be used and the number of multipliers to be used do not exceed the number of provided memories and the number of provided multipliers.

However, when a complicated process such as filtering is performed many times, the number of multipliers to be used exceeds the number of multipliers provided in the FPGA.

In this case, the bit width of multiplication may be reduced or algorithm may be changed so as not to use multiplication to reduce multipliers to be used. If the bit width of multiplication is reduced, the accuracy of computation becomes lower. If the algorithm is changed, the number of computations is increased.

In addition, if an FPGA including more multipliers is selected, the cost is increased.

A multiplier is an example of a computing unit including a plurality of logic devices and is configured with a plurality of logic devices provided in an FPGA.

Therefore, the design needs to be made so that the number of computing units other than multipliers does not exceed the number that can be configured using logic devices provided in an FPGA.

As described above, circuit sharing is performed automatically in high level synthesis. Accordingly, computing units are shared by high level synthesis, the number of computing units to be used is reduced, and the number of computing units to be used may fall within the range that can be mounted on an FPGA.

Patent Literature 1 discloses the generation of a circuit that shares hardware resources between parallel descriptions.

Patent Literature 2 discloses reduction in the circuit scale by detecting the sub-graph for which the circuit area reduced by execution in a common circuit is large.

However, Patent Literature 1 and Patent Literature 2 do not disclose reduction in the number of computing units to be used by increasing memories to be used. That is, Patent Literature 1 and Patent Literature 2 do not disclose reducing the number of computing units to be used by effectively utilizing unused memories in an FPGA so that the number of computing units to be used falls within the range that can be mounted on an FPGA.

Since the conventional high level synthesis tool converts arrays to registers or memories according to an instruction of the designer, the number of memories to be used is not increased to reduce the number of computing units to be used. That is, the number of memories to be used does not become the number intended by the designer or more.

When the design target is an ASIC, since the cost is increased when the number of memories is increased, the design is made so that the number of memories is reduced basically.

In contrast, when the design target is an FPGA, the effective utilization of unused memories is more efficient.

However, the effective utilization of unused memories is not performed in the conventional high level synthesis.

CITATION LIST

Patent Literature

Patent Literature 1: JP 2000-187681 A
Patent Literature 2: JP 2006-139427 A

SUMMARY OF INVENTION

Technical Problem

An object of the invention is to support the design of a circuit in which a computing unit is shared among a plurality of processes performing computations of an identical type.

Solution to Problem

A circuit design support apparatus according to the present invention includes:

a target specification section to specify, among processes indicated in a scheduling result file indicating that one or more processes are assigned to each of a plurality of process steps to be executed sequentially, a target process that is a process performing computation and an identical-type process that is a process assigned to a process step to be executed after a process step to which the target process is assigned and performing computation which is identical in type to the target process;

a destination specification section to specify, as a destination step, a process step in which a computing unit can be shared between the target process and the identical-type process when the target process is assigned thereto; and a scheduling change section to change description of the scheduling result file to description in a state in which the target process has been assigned to the destination step.

Advantageous Effects of Invention

According to the invention, it is possible to support the design of a circuit in which a computing unit is shared among a plurality of processes performing computations of an identical type.

BRIEF DESCRIPTION OF DRAWINGS

FIG. 4 is a diagram illustrating a source code 101 according to the first embodiment;
FIG. 7 is a diagram illustrating a step result file 104 according to the first embodiment;
FIG. 9 is a diagram illustrating an identical-type computing unit list 191 according to the first embodiment;
FIG. 10 is a diagram illustrating a target process list 192 according to the first embodiment;
FIG. 12 is a diagram illustrating the target process list 192 according to the first embodiment;
FIG. 14 is a diagram illustrating the target process list 192 according to the first embodiment;
FIG. 17 is a diagram illustrating a step change file 194 according to the first embodiment.

DESCRIPTION OF EMBODIMENTS

First Embodiment

Figure 1:
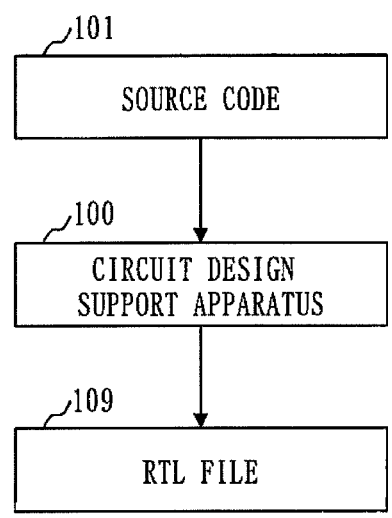
FIG. 1 is a schematic diagram of a circuit design support apparatus 100 according to a first embodiment.
Figure 2:
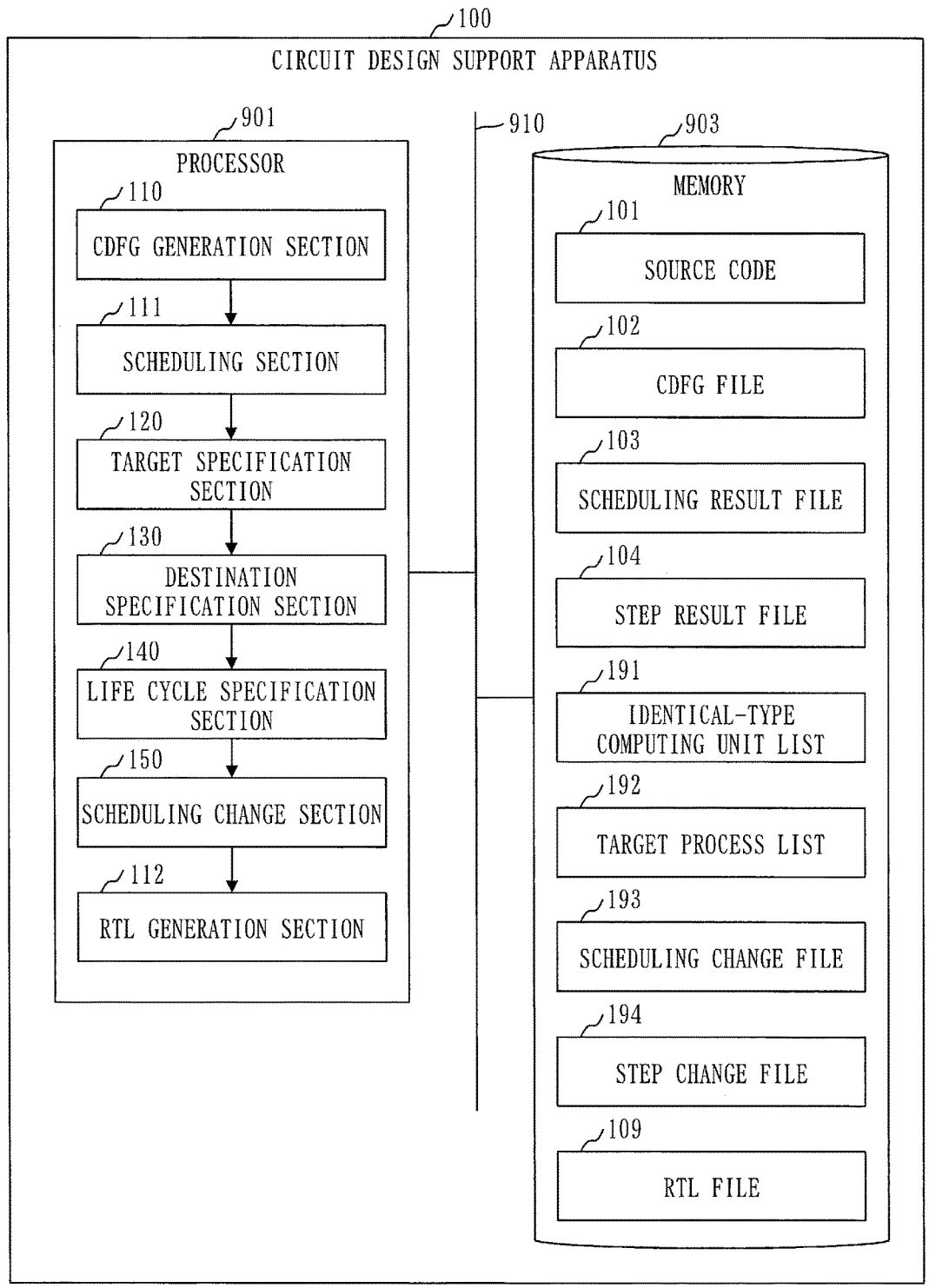
FIG. 2 is a structural diagram of the circuit design support apparatus 100 according to the first embodiment.
Figure 3:
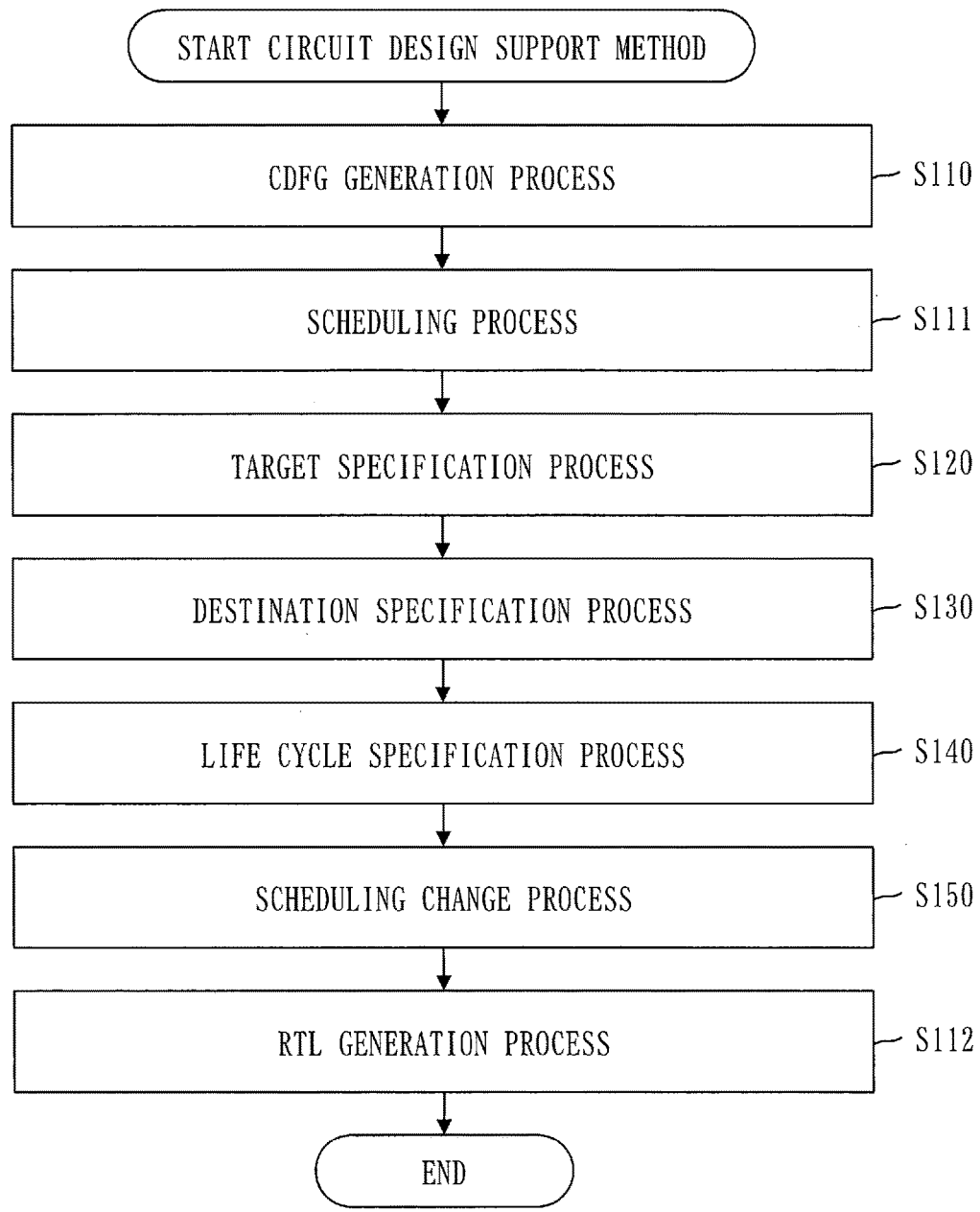
FIG. 3 is a flowchart of a circuit design support method according to the first embodiment.

The circuit design support apparatus 100 for supporting the design of a circuit will be described with reference to FIGS. 1 to 19. Specifically, the circuit to be designed is a semiconductor integrated circuit.
*Description of Structure*
An outline of the circuit design support apparatus 100 will be described with reference to FIG. 1.
The circuit design support apparatus 100 generates an RTL file 109 based on a source code 101.

The source code 101 is a file in which the description of the operation of a circuit is written in a high level language. Specifically, the high level language is the C language, the C++ language, or the SystemC language.
The RTL file 109 is a file in which the description of the operation of the circuit is written in HDL (Hardware Description Language). RTL is an abbreviation of Register Transfer Level.
The structure of the circuit design support apparatus 100 will be described with reference to FIG. 2.
The circuit design support apparatus 100 is a computer including a processor 901 and a memory 903. The processor 901 is connected to the memory 903 via a signal line 910.
The processor 901 is an IC (Integrated Circuit) for processing. Specifically, the processor 901 is a CPU, a DSP, or a GPU. CPU is an abbreviation of Central Processing Unit, DSP is an abbreviation of Digital Signal Processor, and GPU is an abbreviation of Graphics Processing Unit.
The memory 903 is a storage unit for storing data. Specifically, the memory 903 is a RAM (Random Access Memory).
The memory 903 stores data to be used, generated, or input/output by the circuit design support apparatus 100.
Specifically, the memory 903 stores the source code 101, a CDFG file 102, a scheduling result file 103, a step result file 104, and the RTL file 109. In addition, the memory 903 stores an identical-type computing unit list 191, a target process list 192, a scheduling change file 193, and a step change file 194. The description of such data will be described later.
Other than the above, the memory 903 stores OS (Operating System) and programs for achieving the functions of "sections". Specifically, the "sections" are a CDFG generation section 110, a scheduling section 111, a target specification section 120, a destination specification section 130, a life cycle specification section 140, a scheduling change section 150, and an RTL generation section 112. It should be noted that the programs for achieving the functions of "sections" can be stored in a storage medium. The functions of "sections" will be described later.
The processor 901 executes the programs for achieving the functions of "sections" while executing the OS. That is, the programs for achieving the functions of "sections" are loaded into the memory 903 and executed by the processor 901.
It should be noted that the circuit design support apparatus 100 may include a plurality of processors 901 so that the plurality of processors 901 executes the programs for achieving the functions of "sections" in cooperation.
Hardware including the processor 901 and the memory 903 is collectively referred to as "processing circuitry".
"Sections" may be read as "steps", "procedures", or "processes". The functions of "sections" may be achieved by firmware.
*Description of Operation*
The operation of the circuit design support apparatus 100 is equivalent to the circuit design support method. In addition, the circuit design support method is equivalent to the processing procedure of a circuit design support program.
The circuit design support method will be described with reference to FIG. 3.
S110 is a CDFG generation process. CDFG is an abbreviation of Control Data Flow Graph.
In S110, the CDFG generation section 110 generates the CDFG file 102 using the source code 101.

Since the CDFG generation process (S110) is generally performed in high level synthesis, details of the process are not described here.

FIG. 4 illustrates the specific description of the source code 101 written in the C language.

Three process blocks are written in this source code 101. A process block is a collection of one or more processes.

The first process block includes a process that computes a[i] *b[i] and a process that computes a function func0.

The second process block includes a process that computes the function func1.

The third process block includes a process that computes c[i] *p.

The processes in the first process block and the process in the third process block are executed repeatedly 1024 times using the for statement.

Returning to FIG. 3, description will be continued from S111.

S111 is a scheduling process.

In S111, the scheduling section 111 generates the scheduling result file 103 and the step result file 104 using the CDFG file 102.

Since the scheduling process (S111) is generally performed in high level synthesis, details of the process are not described here.

It should be noted that the scheduling process (S111) is equivalent to a scheduling process in a broad sense and is a process including an allocation process in high level synthesis. The allocation process is also referred to as a binding process.

The scheduling result file 103 indicates that each of a plurality of process blocks to be executed sequentially has one or more process steps and one or more processes are assigned to each of a plurality of process steps to be executed sequentially.

Figure 5:
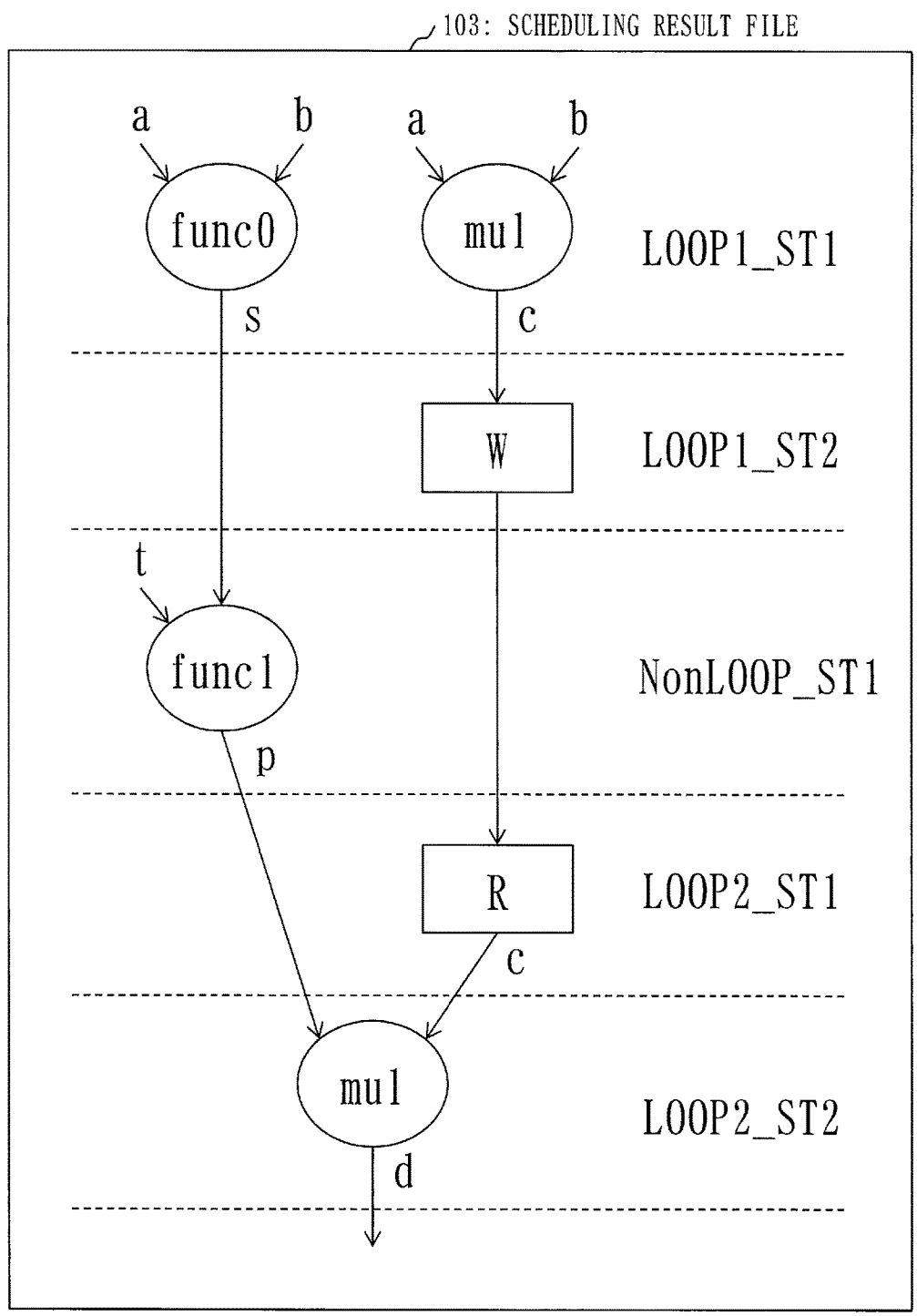
FIG. 5 is a diagram illustrating the description of a scheduling result file 103 according to the first embodiment.

FIG. 5 illustrates the description of the scheduling result file 103 generated by using the CDFG file 102 generated based on the source code 101 in FIG. 4.

In this drawing, LOOP1, NonLOOP, and LOOP2 are block names. LOOP1_ST1, LOOP1_ST2, Non_LOOP_ST1, LOOP2_ST1, and LOOP2_ST2 are step names. In addition, mul is a process name of a multiplication process, W is a process name of a write process, and R is a process name of a read process. In addition, the func0 and the func1 are function names.

The scheduling result file 103 indicates that the process block LOOP1 has the process step LOOP1_ST1 and the process step LOOP1_ST2. In addition, the scheduling result file 103 indicates that the process that computes c=a*b and the process that computes the func0 are assigned to the process step LOOP1_ST1 and the process that writes c to the memory is assigned to the process step LOOP1_ST2.

The scheduling result file 103 indicates that the process block NonLOOP has the process step NonLOOP_ST1. In addition, the scheduling result file 103 indicates that the process that computes the func1 is assigned to the process step NonLOOP_ST1.

In addition, the scheduling result file 103 indicates that the process block LOOP2 has the process step LOOP2_ST1 and the process step LOOP2_ST2. In addition, the scheduling result file 103 indicates that the process that reads c from the memory is assigned to the process step LOOP2_ST1 and the process that computes p*c is assigned to the process step LOOP2_ST2.

Figure 6:
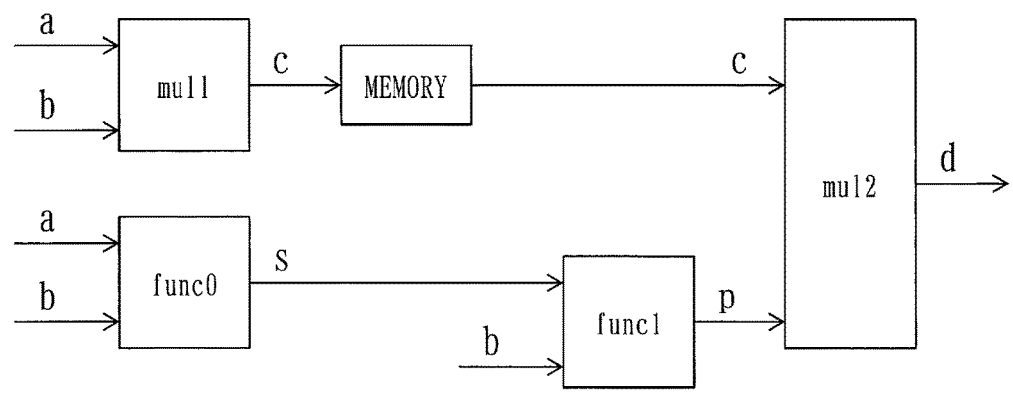
FIG. 6 is a diagram illustrating a circuit structure designed by a conventional method.

FIG. 6 illustrates the structure of a circuit generated by using the RTL file 109 when the RTL file 109 is generated by using the scheduling result file 103 in FIG. 5. This circuit has one memory and two multipliers mul1 and mul2.

The step result file 104 indicates information for specifying the process steps in which computing units and memories are used.

The computing units are devices for performing computation such as addition, subtraction, multiplication, or division. Specifically, the computing units are an adder, a subtractor, a multiplier, a divider, or a combination thereof.

FIG. 7 illustrates the description of the step result file 104 generated by using the CDFG file 102 generated based on the source code 101 in FIG. 4.

In this drawing, mul is a multiplier name, MEM0_0 is a memory name, and func0 and func1 are computing unit names for identifying the computing units that compute functions. USE indicates that the computing unit is used, W indicates the memory is used in a write process, and R indicates that the memory is used in a read process. LOOP1, NonLOOP, and Loop2 are the block names and ST1 and ST2 are parts of the step names.

The step result file 104 indicates that the multiplier mul is used in the process step LOOP1_ST1 and the process step LOOP_ST2. The step result file 104 indicates that the computing unit func0 is used in the process step LOOP1_ST1 and the computing unit func1 is used in the process step NonLOOP. In addition, the step result file 104 indicates that the memory MEM0_0 is used in the process step LOOP1_ST2 and the process step LOOP2_ST1.

In addition, the step result file 104 indicates that the repetition count of the process block LOOP1 and the repetition count of the process block LOOP2 are 1024. In addition, the step result file 104 indicates that NonLOOP is not executed repeatedly, that is, the repetition count of NonLOOP is one. The repetition count is the number of repetition executions of the process.

Returning to FIG. 3, description will be continued from S120.

S120 is a target specification process.

In S120, the target specification section 120 specifies a target process and an identical-type process among the processes indicated in the scheduling result file 103. The target process is a process that performs computation. The identical-type process is a process assigned to a process step to be executed after a process step to which the target process is assigned and performs computation that is identical in type to the target process.

It should be noted that when a computing process that is a process performing computation and another process that is a process different from the computing process are assigned to a single process step, the target specification section 120 specifies the computing process as the target process on a condition that an output of the computing process is not an input of the other process.

Figure 8:
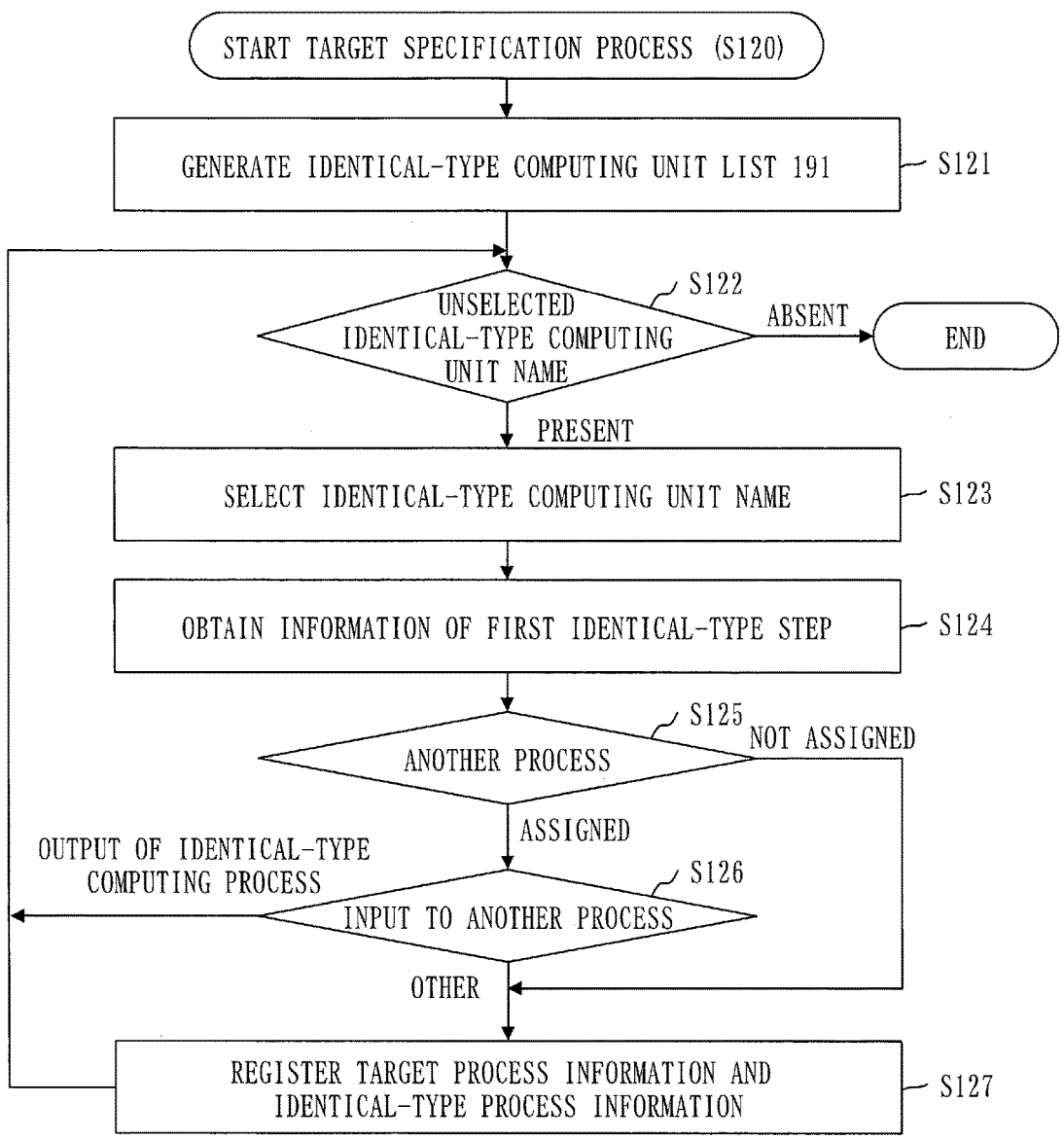
FIG. 8 is a flowchart of a target specification process (S120) according to the first embodiment.

Details of the target specification process (S120) will be described with reference to FIG. 8.

In S121, the target specification section 120 obtains an identical-type computing unit name from the step result file 104. An identical-type computing unit is a computing unit used in a plurality of process steps and the identical-type computing unit name is the computing unit name for identifying the identical-type computing unit. The step result file 104 in FIG. 7 indicates that the multiplier mul is used in the process step LOOP1_ST1 and the process step LOOP2_ST2. Accordingly, the identical-type computing unit name is mul in the step result file 104 in FIG. 7.

Then, the target specification section 120 generates the identical-type computing unit list 191 and registers the identical-type computing unit name, a first identical-type step name, and a second identical-type step name in the generated identical-type computing unit list 191. The first identical-type step is a process step to be executed first among the two process steps in which the identical-type computing unit is used. The first identical-type step name is a step name identifying the first identical-type step. The second identical-type step is a process step to be executed second among the two process steps in which the identical-type computing unit is used. The second identical-type step name is a step name identifying the second identical-type step.

FIG. 9 illustrates the identical-type computing unit list 191 generated by using the step result file 104 in FIG. 7.

The identical-type computing unit list 191 indicates that the multiplier mul, which is the identical-type computing unit, is used in the first identical-type step LOOP1_ST1 and the second identical-type step LOOP_ST2.

Returning to FIG. 8, description will be continued from S122.

In S122, the target specification section 120 determines whether there is an unselected identical-type computing unit name not selected from the identical-type computing unit list 191.

When there is an unselected identical-type computing unit name, the processing proceeds to S123.

When there is no unselected identical-type computing unit name, the target specification process (S120) ends.

In S123, the target specification section 120 selects one unselected identical-type computing unit name from the identical-type computing unit list 191.

In S124, the target specification section 120 obtains the first identical-type step name associated with the selected identical-type computing unit name from the identical-type computing unit list 191.

Then, the target specification section 120 obtains information of the first identical-type step identified by the obtained first identical-type step name from the scheduling result file 103.

In S125, the target specification section 120 determines whether another process has been assigned to the first identical-type step, using the obtained information. Another process is a process different from the identical-type computing process and the identical-type computing process is a process having a name corresponding to the identical-type computing unit name.

When another process is assigned, the processing proceeds to S126.

When another process is not assigned, the processing proceeds to S127.

In the identical-type computing unit list 191 in FIG. 9, the identical-type computing unit name is mul and the first identical-type step name is LOOP1_ST1.

In the scheduling result file 103 in FIG. 5, the process that computes the function func0 is assigned to the first identical-type step LOOP1_ST1 in addition to the identical-type computing process mul. That is, another process func0 is assigned to the first identical-type step LOOP1_ST1. Accordingly, the processing proceeds to S126.

In S126, the target specification section 120 determines whether an output of the identical-type computing process is an input to another process.

When the output of the identical-type computing process is input to another process, the processing returns to S122.

When the output of the identical-type computing process is not input to another process, the processing proceeds to S127.

In the scheduling result file 103 in FIG. 5, the inputs of another process func0 are an input value a and an input value b. That is, an output value c output from the identical-type computing process mul is not input to another process func0. Accordingly, the processing proceeds to S127.

In S127, the target specification section 120 registers target process information and identical-type process information in the target process list 192. The target process information is information for specifying the target process and the target process is the identical-type computing process assigned to the first identical-type step. The identical-type process information is information for specifying the identical-type process and the identical-type process is the identical-type computing process assigned to the second identical-type step.

Upon completion of S127, the processing returns to S122.

FIG. 10 illustrates the target process list 192 generated by using the identical-type computing unit list 191 in FIG. 9 and the scheduling result file 103 in FIG. 5.

In the target process list 192, mul that is a process name and LOOP1_ST1 that is a process step name are registered as the target process information. In addition, in the target process list 192, the process name mul and the process step name LOOP_ST2 are registered as the identical-type process information.

Returning to FIG. 3, description will be continued from S130.

S130 is a destination specification process.

In S130, the destination specification section 130 specifies a destination step which is a destination of the target process. The destination step is a process step in which the computing unit can be shared between the target process and the identical-type process when the target process is assigned thereto.

The destination specification section 130 specifies the destination step among the process steps executed after the process step to which the target process has been assigned is executed and before the process step to which the identical-type process has been assigned is executed.

The destination specification section 130 specifies the destination step in the following procedure.

The destination specification section 130 specifies, as candidate steps, process steps to which an affected process has not been assigned and specifies the destination step among the specified candidate steps. The affected process is a process that performs computation and receives a value output from the target process.

The destination specification section 130 specifies the destination step as described below.

The destination specification section 130 specifies, as the destination step, a candidate step included in the process block having the process step to which the identical-type process has been assigned among the specified candidate steps.

Figure 11:
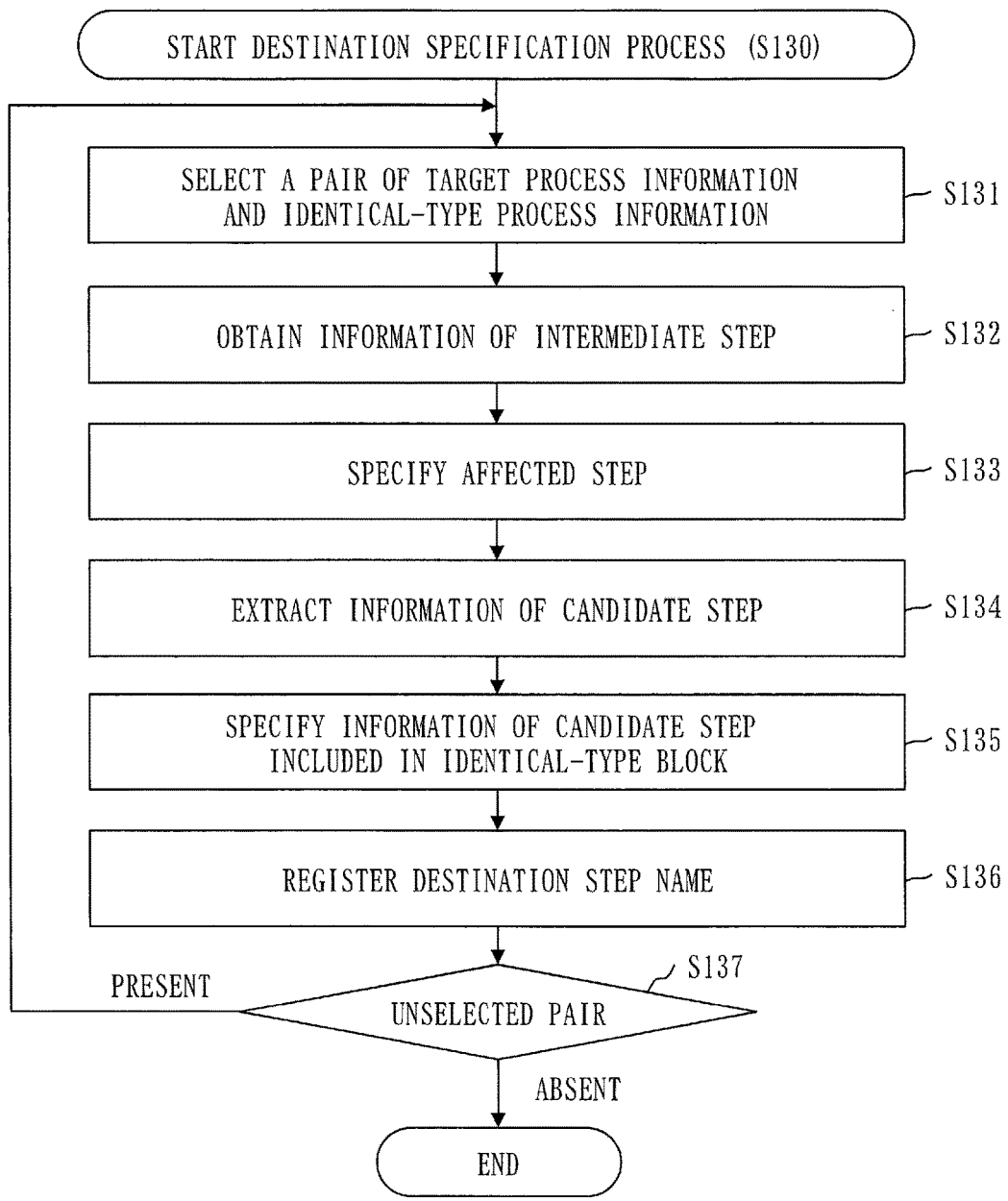
FIG. 11 is a flowchart of a destination specification process (S130) according to the first embodiment.

Details of the destination specification process (S130) will be described with reference to FIG. 11.

In S131, the destination specification section 130 selects one unselected pair among pairs of the target process information and the identical-type process information from the target process list 192.

In S132, the destination specification section 130 obtains, as a target step name, the step name of the target step, which is the process step to which the target process has been assigned, from the target process information. In addition, the destination specification section 130 obtains, as an identical-type step name, the step name of the identical-type step, which is the process step to which the identical-type process has been assigned, from the identical-type process information.

Then, the destination specification section 130 obtains, as information of intermediate steps, information of process steps which are present between the target step identified by the target step name and the identical-type step identified by the identical-type step name, from the scheduling result file 103. The intermediate steps are the process steps executed after the target step is executed and before the identical-type step is executed.

In the scheduling result file 103 in FIG. 5, it is assumed that the target process is the process mul in the process step LOOP1_ST1 and the identical-type process is the process mul in the process step LOOP_ST2. In this case, the intermediate steps are LOOP1_ST2, NonLOOP_ST1, and LOOP2_ST1.

In S133, the destination specification section 130 specifies the affected step, which is a process step logically affected when the target process is assigned, based on the information of the intermediate steps.

Specifically, the destination specification section 130 specifies the affected step as described below.

First, the destination specification section 130 specifies the intermediate steps to which the computing processes have been assigned.

Next, the destination specification section 130 determines whether a value output from the target process is input to the computing processes having been assigned to the specified intermediate steps.

Then, the destination specification section 130 specifies, as the affected steps, the intermediate steps to which the computing processes receiving the value output from the target process have been assigned.

In the scheduling result file 103 in FIG. 5, it is assumed that the target process is the process mul in the process step LOOP1_ST1 and the intermediate steps are LOOP1_ST2, NonLOOP_ST1, and LOOP2_ST1. In this case, no computing process is assigned to the intermediate step LOOP1_ST2 and the intermediate step LOOP2_ST1 and the output value c of the target process mul is not input to the computing process func1 assigned to the intermediate step NonLOOP_ST1. Accordingly, neither of the intermediate steps is an affected step.

In S134, the destination specification section 130 extracts information of the intermediate steps that are not affected steps as information of candidate steps from the obtained information of the intermediate steps.

In S135, the destination specification section 130 obtains, from the identical-type process information, the block name of the identical-type block, which is the process block having the identical-type step, as the identical-type block name.

Then, the destination specification section 130 specifies the information of the candidate step included in the identical-type block identified by the identical-type block name from the information of the respective candidate steps.

When the identical-type process is the process mul in the process step LOOP_ST2 in the scheduling result file 103 in FIG. 5, the identical-type block is the process block LOOP2. In addition, when the candidate steps are LOOP1_ST2, NonLOOP_ST1, and LOOP2_ST1, the candidate step included in the identical-type block is LOOP2_ST1.

In S136, the destination specification section 130 obtains, as the destination step name, the candidate step name from the information of the specified candidate step.

Then, the destination specification section 130 registers the destination step name in the target process list 192.

FIG. 12 illustrates the target process list 192 in which the destination step name has been registered.

LOOP2_ST1 is registered in the target process list 192 as the destination step name for identifying the destination step of the target process mul.

In S137, the destination specification section 130 determines whether an unselected pair of the target process information and the identical-type process information is present in the target process list 192.

When there is an unselected pair, the processing returns to S131.

When there is no unselected pair, the destination specification process (S130) ends.

Returning to FIG. 3, description will be continued from S140.

S140 is a life cycle specification process.

In S140, the life cycle specification section 140 specifies a life cycle of the output value output from the target process in a state in which the scheduling result file 103 is not yet changed. This life cycle represents a time period after the output value output from the target process is written to the memory until the output value is read from the memory to which the output value has been written.

Figure 13:
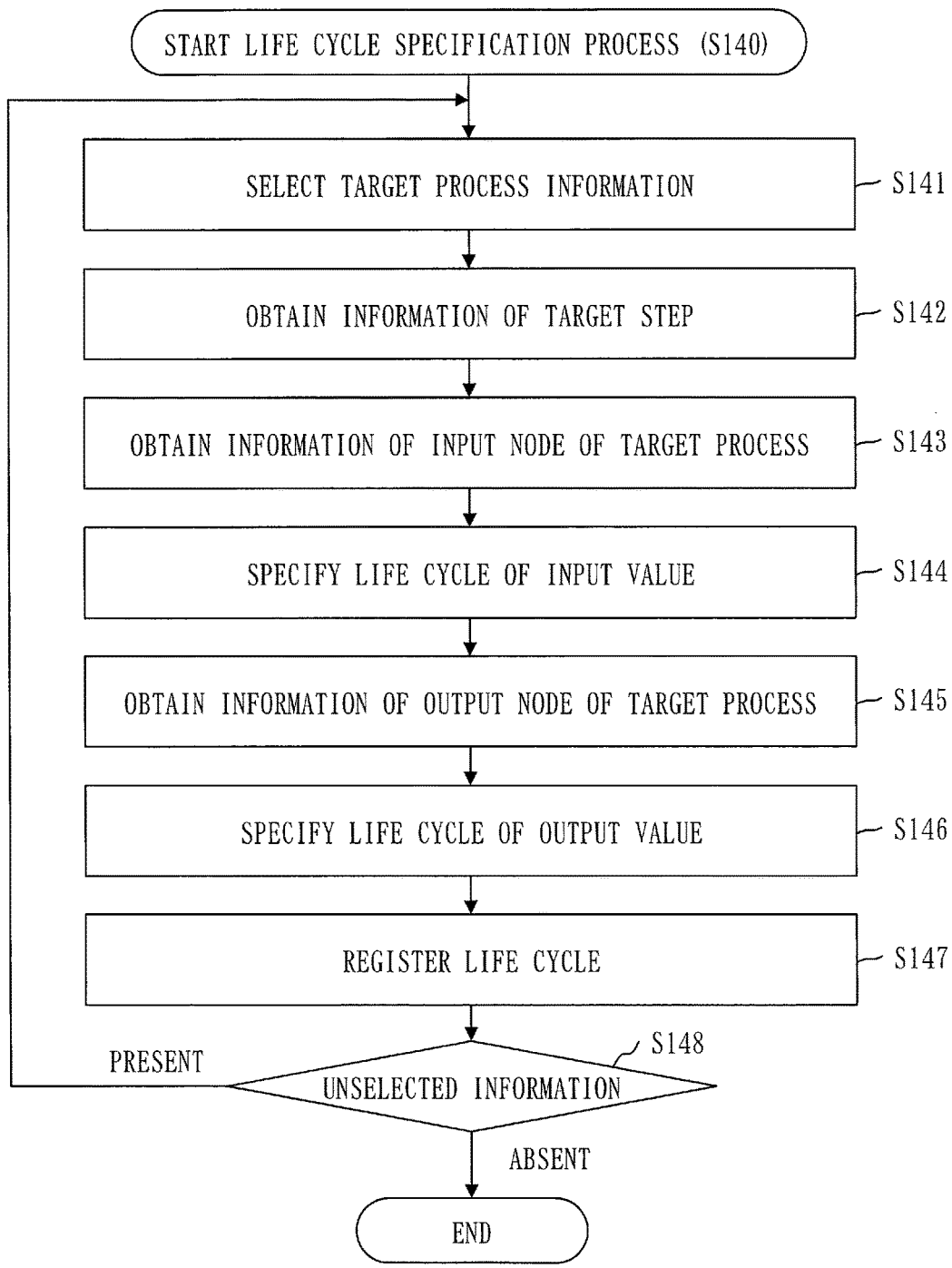
FIG. 13 is a flowchart of a life cycle specification process (S140) according to the first embodiment.

Details of the life cycle specification process (S140) will be described with reference to FIG. 13.

In S141, the life cycle specification section 140 selects one piece of unselected target process information from the target process list 192.

In S142, the life cycle specification section 140 obtains the target step name from the selected target process information and obtains the information of the target step identified by the obtained target step name from the scheduling result file 103.

In S143, the life cycle specification section 140 obtains an input node name for identifying an input node of the target process from the obtained information of the target step. The input node is a variable for which an input value is set.

Then, the life cycle specification section 140 obtains information of the input node identified by the input node name from the scheduling result file 103 and the step result file 104.

In S144, the life cycle specification section 140 specifies the life cycle of the input value of the target process on the basis of the information of the input node of the target process.

The life cycle is the number of cycles that represents a time period after a value is set for a variable until the value having been set for the variable disappears.

When the process mul in the process step LOOP1_ST1 is the target process in the scheduling result file 103 in FIG. 5, the input nodes of the target process are a and b.

Since input values are set for the input nodes a and b for each cycle, the life cycles of the input values of the target process are one cycle.

In S145, the life cycle specification section 140 obtains an output node name for identifying an output node of the target process from the obtained information of the target step. The output node is a variable for which an output value is set.

Then, the life cycle specification section 140 obtains information of the output node identified by the output node name from the scheduling result file 103 and the step result file 104.

In S146, the life cycle specification section 140 specifies the life cycle of the output value of the target process on the basis of the information of the output node of the target process.

When the process mul in the process step LOOP1_ST1 is the target process in the scheduling result file 103 in FIG. 5, the output node of the target process is c. The output value set for the output node c is written to the memory in the write process W and retained in the memory until the value is read from the memory in the read process R. In other words, the output value output from the target process mul is retained in the memory until the process block LOOP1_ST1 to which the target process mul belongs is completed.

In the step result file 104 in FIG. 7, the repetition count of the process block LOOP1 to which the target process mul belongs is 1024. That is, the output value of the target process mul is retained in the memory MEM0_0 for 1024 cycles at the maximum. Accordingly, the life cycle of the output value of the target process is 1024 cycles.

In S147, the life cycle specification section 140 registers the life cycle of the input value of the target process and the life cycle of the output value of the target process in the target process list 192.

FIG. 14 illustrates the target process list 192 in which the life cycles have been registered.

One cycle that is a life cycle of the input value of the target process mul and 1024 cycles that are life cycles of the output value of the target process mul are registered in the target process list 192.

In S148, the life cycle specification section 140 determines whether unselected target process information is present in the target process list 192.

When unselected target process information is present, the processing returns to S141.

When unselected target process information is absent, the life cycle specification process (S140) ends.

Returning to FIG. 3, description will be continued from S150.

In S150, the scheduling change section 150 changes the description of the scheduling result file 103 to description in a state in which the target process has been assigned to the destination step.

Specifically, the scheduling change section 150 changes the description of the scheduling result file 103 as described below.

It is assumed that the target process, the identical-type process, and the plurality of process steps meet the following conditions.

The target process is a process that performs computation using an input value that is a value input thereto and outputs a value obtained by the computation as an output value.

The identical-type process is a process that receives the output value output from the target process and performs computation using the received output value.

The plurality of process steps includes a write step that is a process step to which a write process has been assigned and a read step that is a process step to which a read process has been assigned. The write process is a process that writes the output value output from the target process to the memory. The read process is a process that reads the output value from the memory to which the output value has been written in order to input the output value to the identical-type process.

The scheduling change section 150 changes the write process having been assigned to the write step to the process that writes the input value to the memory.

In addition, the scheduling change section 150 changes the read process having been assigned to the read step to a process that reads the input value from the memory to which the input value has been written in order to input the input value to the target process.

Then, the scheduling change section 150 assigns the target process to the destination step so that the output value output from the target process is input to the identical-type process.

In addition, the scheduling change section 150 changes the storage capacity of the memory used by the write process and the read process to the storage capacity that depends on the specified life cycle.

Figure 15:
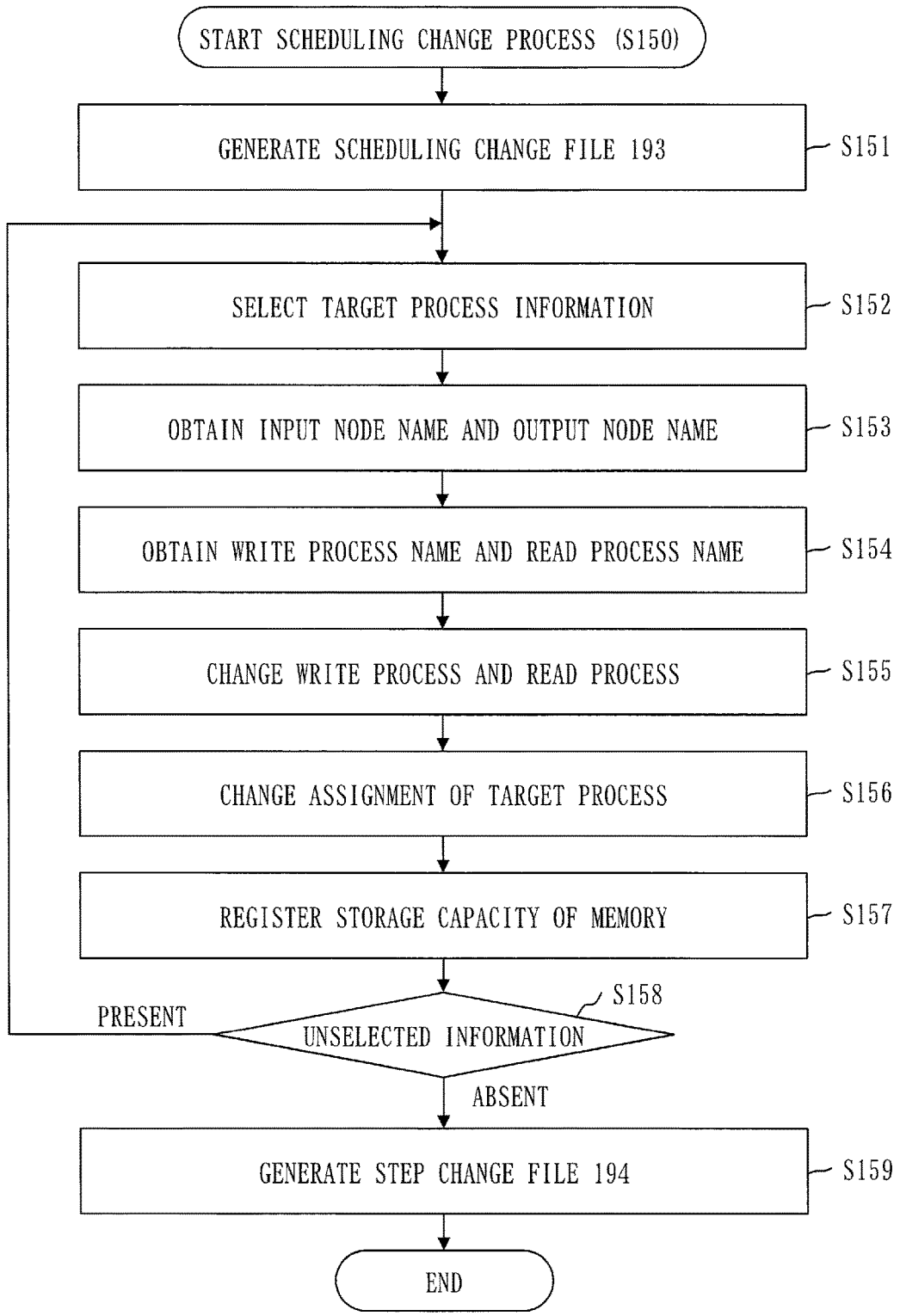
FIG. 15 is a flowchart of a scheduling change process (S150) according to the first embodiment.

Details of the scheduling change process (S150) will be described with reference to FIG. 15.

In S151, the scheduling change section 150 duplicates the scheduling result file 103.

The duplicated scheduling result file 103 is referred to below as the scheduling change file 193.

In S152, the scheduling change section 150 selects one piece of unselected target process information from the target process list 192.

In S153, the scheduling change section 150 obtains the target process name and the target step name from the selected target process information.

Next, the scheduling change section 150 obtains the information of the target step identified by the obtained target step name from the scheduling change file 193.

Then, the scheduling change section 150 obtains the input node name for identifying the input node of the target process and the output node name for identifying the output node of the target process from the obtained information of the target step.

When the process mul in the process step LOOP1_ST1 is the target process in the scheduling result file 103 in FIG. 5, the input nodes are a and b and the output node is c.

In S154, the scheduling change section 150 obtains the write process name, the write step name, the read process name, and the read step name from the scheduling change file 193 using the output node name obtained in S153.

The write process name is the process name of the write process and the write process is a process that writes the output value set for the output node identified by the output node name to the memory.

The write step name is the step name of the write step and the write step is a process step to which the write process has been assigned.

The read process name is the process name of the read process and the read process is a process that reads the output value written to the memory by the write process.

The read step name is the step name of the read step and the read step is a process step to which the read process has been assigned.

When the output node is c in the scheduling result file 103 in FIG. 5, the write process is W, the write step is LOOP1_ST2, the read process is R, and the read step is LOOP2_ST1.

In S155, the scheduling change section 150 changes the write process and the read process in order to assign the target process to the destination step.

The scheduling change section 150 changes the write process as described below.

The scheduling change section 150 deletes the write process identified by the write process name from the write step identified by the write step name.

Then, the scheduling change section 150 adds, to the write step, the write process that writes the input value set for the input node identified by the input node name obtained in S153 to the memory.

The scheduling change section 150 changes the read process as described below.

The scheduling change section 150 deletes the read process identified by the read process name from the read step identified by the read step name.

Then, the scheduling change section 150 adds, to the read step, the read process that reads the input value from the memory to which the input value has been written.

Figure 16:
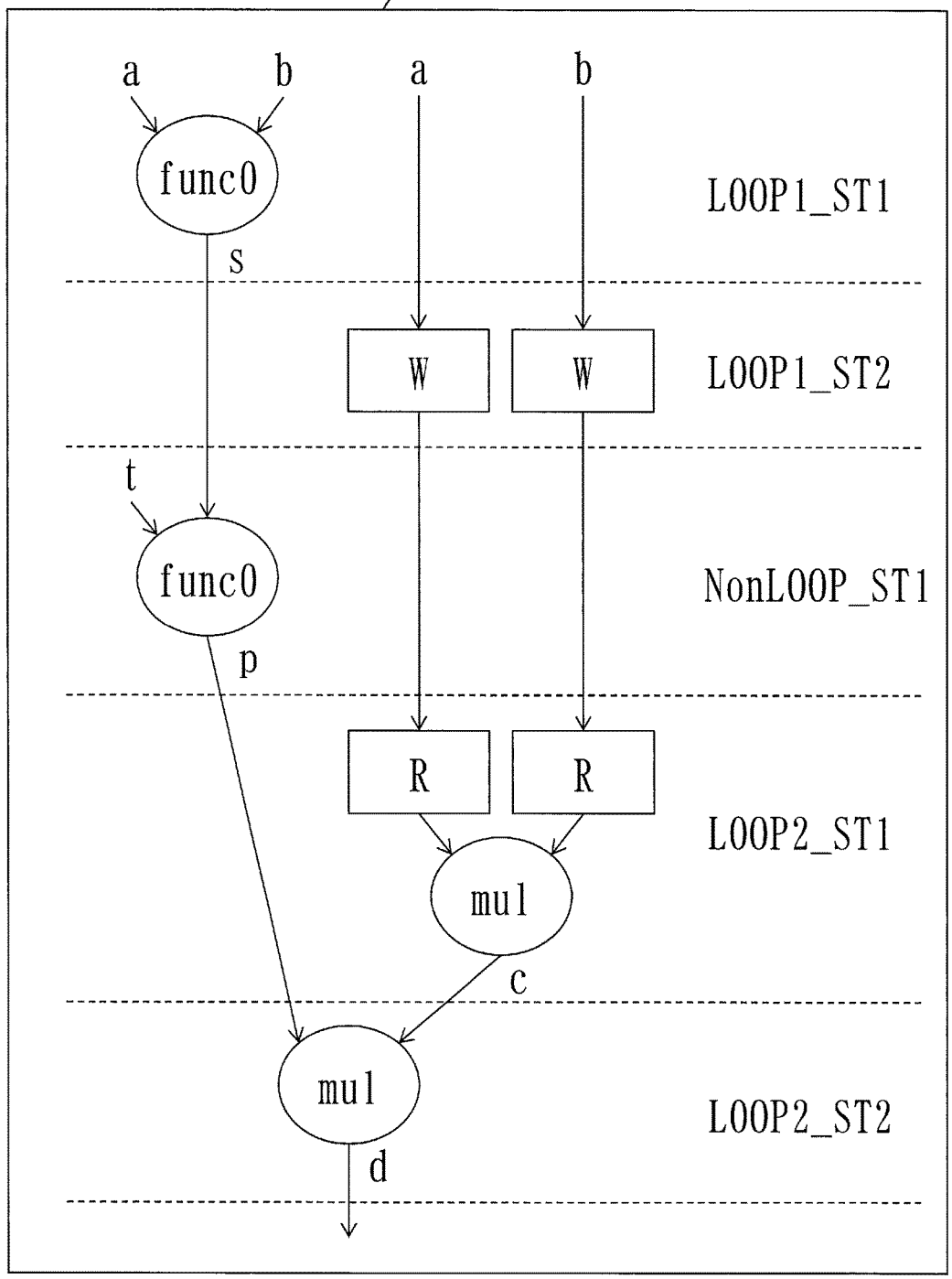
FIG. 16 is a diagram illustrating the description of a scheduling change file 193 according to the first embodiment.

FIG. 16 illustrates the scheduling change file 193 obtained by changing the scheduling result file 103 in FIG. 5.

In the scheduling change file 193, two write processes W are assigned to the write step LOOP1_ST2. A first write process is a process that writes the input value set for the input node a to the first memory and a second write process is a process that writes the input value set for the input node b to the second memory.

In addition, two read processes R are assigned to the read step LOOP2_ST1. A first read process is a process that reads the input value set for the input node a from the first memory and a second read process is a process that reads the input value set for the input node b from the second memory.

In S156, the scheduling change section 150 changes the assignment of the target process using the target process name and the target step name obtained in S152.

The scheduling change section 150 changes the assignment of the target process as described below.

The scheduling change section 150 deletes the target process identified by the target process name from the target step identified by the target step name.

Next, the scheduling change section 150 obtains the destination step name from the target process list 192.

Then, the scheduling change section 150 adds the target process to the destination step identified by the destination step name. At this time, the scheduling change section 150 registers, in the scheduling change file 193 as a part of the information of the target process, information indicating that the input value read from the memory in the read process becomes the input value of the target process.

In the scheduling change file 193 in FIG. 16, the target process mul is assigned to the destination step LOOP2_ST1.

In addition, the input values read by the two read processes R are the input values of the target process mul. The input value read by the first read process is the input value set for the input node a and the input value read by the second read process is the input value set for the input node b.

In S157, the scheduling change section 150 calculates the storage capacity of the memory used in the write process added to the write step and the read process added to the read step.

Then, the scheduling change section 150 registers the calculated storage capacity in the scheduling change file 193 as a part of the information of the memory.

The scheduling change section 150 calculates the storage capacity of the memory as described below.

The scheduling change section 150 obtains the life cycles associated with the selected target process information from the target process list 192. The life cycles obtained here are the life cycle of the input value and the life cycle of the output value.

Next, the scheduling change section 150 calculates the number of cycles by dividing the life cycle of the output value by the life cycle of the input value. This number of cycles is equivalent to the number of inputs for which the input value is input to the target process during the life cycle of the output value in the scheduling result file 103.

Then, the scheduling change section 150 calculates, as the storage capacity of the memory, the storage capacity necessary to store as many input values as the calculated number of cycles. That is, the size of the storage capacity of the memory is equal to or more than the total size of as many input values as the calculated number of cycles.

In the target process list 192 in FIG. 14, the life cycle of the input value of the target process mul is one cycle and the life cycle of the output value of the target process mul is 1024 cycles. In this case, the storage capacity necessary to store 1024 (=1024/1) input values is the storage capacity of the memory.

When the size of the input values set for the input nodes a and b is one byte in the scheduling change file 193 in FIG. 16, the storage capacity necessary to store 1024 input values is 1024 bytes. That is, the storage capacity of each of the two memories is 1024 bytes. The first memory is the memory used to write and read the input value set for the input node a and the second input memory is the memory used to write and read the input value set for the input node b.

In S158, the scheduling change section 150 determines whether unselected target process information is present in the target process list 192.

When unselected target process information is present, the processing returns to S151.

When unselected target process information is absent, the processing proceeds to S159.

In S159, the scheduling change section 150 generates the step change file 194 using the scheduling change file 193. The step change file 194 is the step result file 104 corresponding to the scheduling change file 193.

FIG. 17 illustrates the step change file 194 corresponding to the scheduling change file 193 in FIG. 16.

Since the process that generates the step result file 104 is generally performed as a part of a scheduling process in high level synthesis, details of the process in S159 are not described here.

Upon completion of S159, the scheduling change process (S150) ends.

Returning to FIG. 3, description will be continued from S112.

S112 is an RTL generation process.

In S112, the RTL generation section 112 generates the RTL file 109 using the scheduling change file 193.

Since the RTL generation process (S112) is generally performed in high level synthesis, details of the process are not described here.

Upon completion of S112, the process of the circuit design support method ends.

Figure 18:
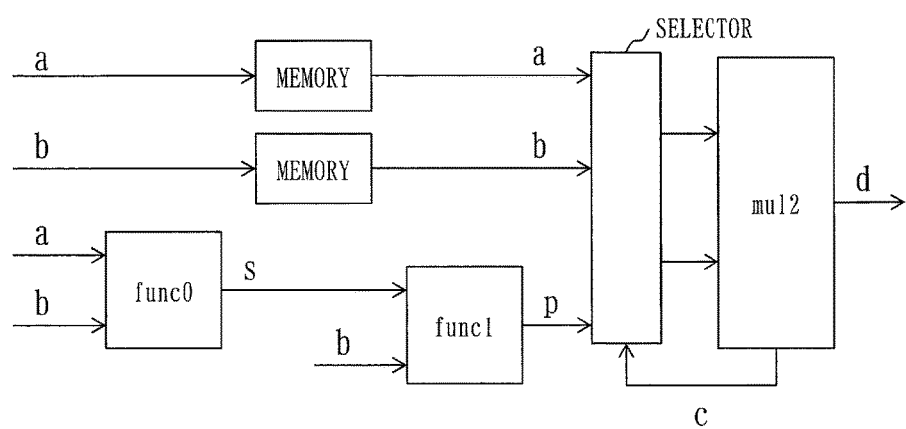
FIG. 18 is a diagram illustrating a circuit structure designed using the first embodiment.

FIG. 18 illustrates the structure of a circuit generated using the RTL file 109 when the RTL file 109 is generated using the step change file 194 in FIG. 16.

This circuit includes two memories and one multiplier referred to as mul. As compared with the circuit illustrated in FIG. 6, the number of memories is increased, but the number of multipliers is reduced.

*Description of Effect of Embodiment*

The circuit design support apparatus 100 can support the design of a circuit in which a computing unit is shared among a plurality of processes that performs computations of an identical type. Specifically, the circuit design support apparatus 100 enables computing units to be shared among a plurality of processes by utilizing unused memories.

This can reduce the number of computing units used in the circuit. That is, when a circuit such as an FPGA (Field-Programmable Gate Array) in which the number of computing units is limited is designed, the number of computing units used in the circuit falls within the limited range.

*Other Structures*

Although an example in which a multiplier is shared among a plurality of multiplications is described above, a computing unit may be shared among a plurality of processes for computing functions. In addition, when the scheduling result file 103 or the step result file 104 indicates the number of computing units for computing functions, the computing units may be shared among a plurality of processes for computing functions in which the number of computing units exceeds a threshold. This threshold can be set by the user in the circuit design support apparatus 100.

When assignment of the target process is changed, the scheduling change section 150 may count the number of memories used and change the assignment of the target process on a condition that the number of memories used does not exceed a threshold. This threshold is the maximum number of memories that can be used in a circuit to be designed.

The function of the circuit design support apparatus 100 may be implemented by hardware.

Figure 19:
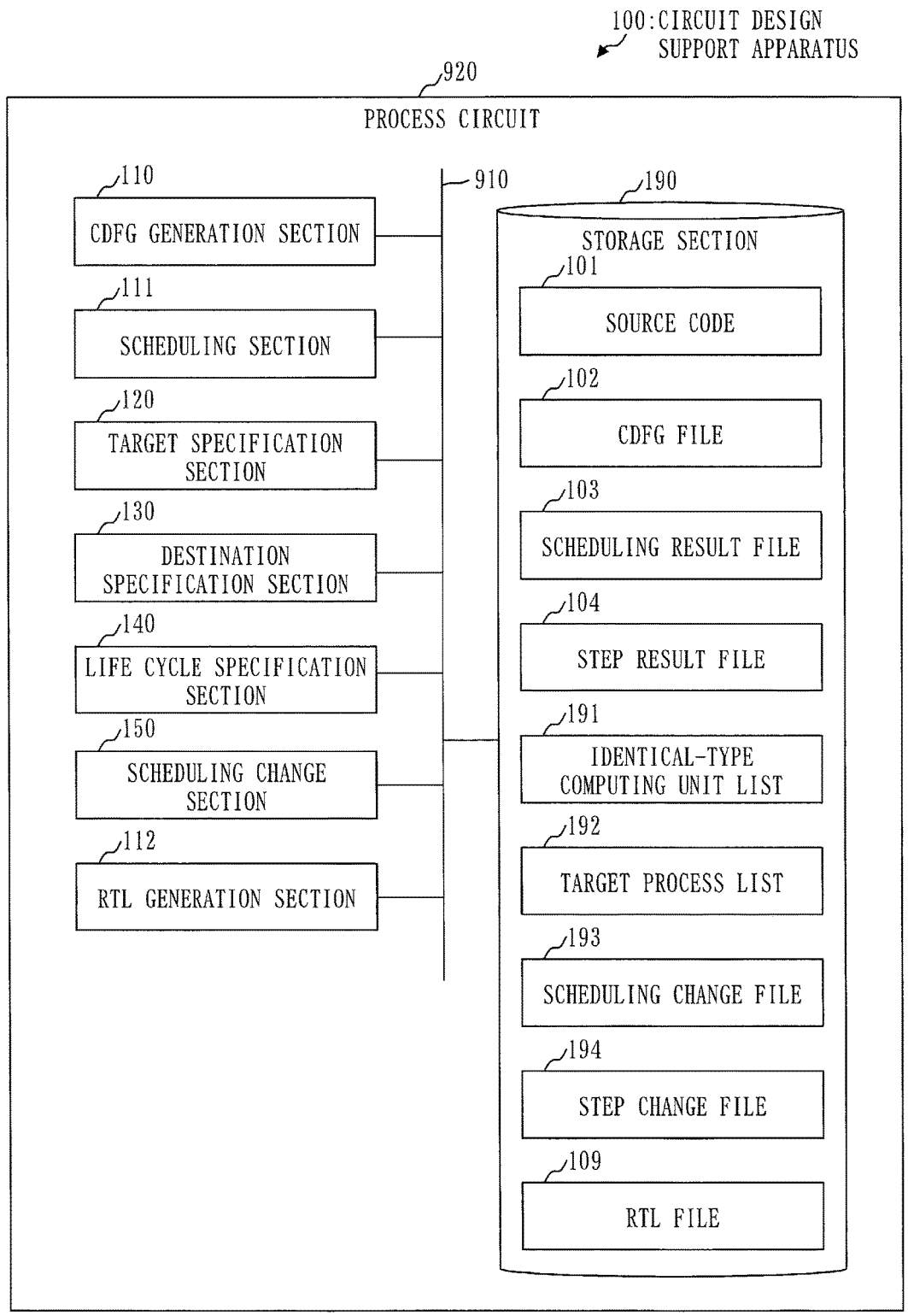
FIG. 19 is a structural diagram of the circuit design support apparatus 100 according to the first embodiment.

FIG. 19 illustrates the structure when the function of the circuit design support apparatus 100 is implemented by hardware.

The circuit design support apparatus 100 has a processing circuit 920. The processing circuit 920 is also referred to as processing circuitry.

The processing circuit 920 is a special electronic circuit for implementing the functions of "sections" such as the CDFG generation section 110, the scheduling section 111, the target specification section 120, the destination specification section 130, the life cycle specification section 140, the scheduling change section 150, the RTL generation section 112, and a storage section 190.

Specifically, the processing circuit 920 is a single circuit, a composite circuit, a programmed processor, a parallel-programmed processor, a logic IC, a GA, an ASIC, an FPGA, or a combination of thereof. GA is an abbreviation of Gate Array and ASIC is an abbreviation of Application Specific Integrated Circuit.

It should be noted that the circuit design support apparatus 100 may have a plurality of the processing circuits 920 and the plurality of the processing circuits 920 may implement the functions of "sections" in cooperation.

The function of the circuit design support apparatus 100 may be implemented by combining hardware with software. That is, a part of the functions of "sections" may be implemented by software while the other of the functions of "sections" is implemented by hardware.

Specifically, the functions of the CDFG generation section 110, the scheduling section 111, and the RTL generation section 112 may be implemented by programs executed by the processor 901 and the functions of the target specification section 120, the destination specification section 130, the life cycle specification section 140, and the scheduling change section 150 may be implemented by the processing circuit 920.

Since the embodiment illustrates a preferable mode, it does not intend to limit the technical scope of the invention. The embodiment may be practiced partially or may be combined with another embodiment.

The procedures described using flowcharts and the like are examples of the procedures of a circuit design support apparatus, a circuit design support method, and a circuit design support program.

REFERENCE SIGNS LIST

100: circuit design support apparatus, 101: source code, 102: CDFG file, 103: scheduling result file, 104: step result file, 109: RTL file, 110: CDFG generation section, 111: scheduling section, 112: RTL generation section, 120: target specification section, 130: destination specification section, 140: life cycle specification section, 150: scheduling change section, 190: storage section, 191: identical-type computing unit list, 192: target process list, 193: scheduling change file, 194: step change file, 901: processor, 903: memory, 910: signal line, 920: processing circuit

The invention claimed is:

1. A circuit design support apparatus comprising:
   processing circuitry to:
   specify, among processes indicated in a scheduling result file indicating that one or more processes are assigned to each of a plurality of process steps to be executed sequentially, a target process that is a process performing computation and an identical-type process that is a process assigned to a process step to be executed after a process step to which the target process is assigned and performing computation which is identical in type to the target process;
   specify, as a destination step, a process step in which a computing unit can be shared between the target process and the identical-type process when the target process is assigned thereto; and
   generating a schedule change file by changing a description of the scheduling result file to a description in a state in which the target process has been assigned to the destination step,
   wherein the scheduling result file is generated by a high level synthesis of source code,
   wherein the processing circuitry specifies the destination step by determining one of the process steps that is executed after execution of the process step to which the target process has been assigned and before execution of the process step to which the identical-type process has been assigned, and logically affected by the target process, and
   wherein the changed description reduces a number of computing units required in a semiconductor integrated circuit that is fabricated according to the scheduling change file by increasing a number of memories used in the semiconductor integrated circuit.

2. The circuit design support apparatus according to claim 1,
   wherein, when a computing process that is a process performing computation and another process that is a process different from the computing process are assigned to a same process step, the processing circuitry specifies the computing process as the target process on a condition that an output of the computing process is not an input of the another process.

3. The circuit design support apparatus according to claim 1,
   wherein the processing circuitry specifies, as candidate steps for the destination step, process steps to which an affected process is not assigned and specifies the destination step among the specified candidate steps, the affected process performing computation and receiving a value output from the target process.

4. The circuit design support apparatus according to claim 3,
wherein the scheduling result file indicates that each of a plurality of process blocks to be executed sequentially has one or more process steps, and
the processing circuitry specifies, as the destination step, a candidate step included in a process block having the process step to which the identical-type process has been assigned, among the specified candidate steps.

5. The circuit design support apparatus according to claim 1,
wherein the target process is a process that performs the computation using an input value that is a value input thereto and outputs a value obtained by the computation as an output value,
the identical-type process is a process that receives the output value output from the target process and performs the computation using the received output value,
the plurality of process steps includes a write step that is a process step to which a write process has been assigned and a read step that is a process step to which a read process has been assigned, the write process writing the output value output from the target process to a memory, the read process reading the output value from the memory to which the output value has been written in order to input the output value to the identical-type process, and
the processing circuitry changes the write process having been assigned to the write step to a process that writes the input value to the memory, changes the read process having been assigned to the read step to a process that reads the input value from the memory to which the input value has been written, in order to input the input value to the target process, and assigns the target process to the destination step so that the output value output from the target process is input to the identical-type process.

6. The circuit design support apparatus according to claim 5,
wherein the processing circuitry specifies a life cycle representing a time period after the output value output from the target process is written to the memory to when the output value is read from the memory and before the output value has been written, in a state in which the scheduling result file is not yet changed, and
changes a storage capacity of the memory used in the write process and the read process to a storage capacity that is in accordance with the specified life cycle.

7. A non-transitory computer readable medium storing a circuit design support program for causing a computer to execute:
a target specification process to specify a target process that is a process performing computation and an identical-type process that is a process assigned to a process step to be executed after a process step to which the target process is assigned and performing computation which is identical in type to the target process among processes indicated in a scheduling result file indicating that one or more processes are assigned to each of a plurality of process steps to be executed sequentially;
a destination specification process to specify, as a destination step, a process step in which a computing unit can be shared between the target process and the identical-type process when the target process is assigned thereto; and
a scheduling change process to generate a schedule change file by changing a description of the scheduling result file to description in a state in which the target process has been assigned to the destination step,
wherein the scheduling result file is generated by a high level synthesis of source code,
wherein the processing circuitry specifies the destination step by determining one of the Process steps that is
executed after execution of the process step to which the target process has been assigned and before execution of the process step to which the identical-type process has been assigned, and
logically affected by the target process, and
wherein the changed description reduces a number of computing units required in a semiconductor integrated circuit that is fabricated according to the scheduling change file by increasing a number of memories used in the semiconductor integrated circuit.

* * * * *